(12) United States Patent
Banin et al.

(10) Patent No.: US 9,231,602 B1
(45) Date of Patent: Jan. 5, 2016

(54) A-PRIORI-PROBABILITY-PHASE-ESTIMATION FOR DIGITAL PHASE-LOCKED LOOPS

(71) Applicant: Intel IP Corporation, Santa Clara, CA (US)

(72) Inventors: Elan Banin, Raanana (IL); Rotem Banin, Pardes-Hana (IL); Ofir Degani, Haifa (IL); Ran Shimon, Ramat Gan (IL); Ashoke Ravi, Hillsboro, OR (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/490,115

(22) Filed: Sep. 18, 2014

(51) Int. Cl.
*H03L 7/06* (2006.01)
*H03L 7/08* (2006.01)
*G04F 10/00* (2006.01)

(52) U.S. Cl.
CPC ............ *H03L 7/0802* (2013.01); *G04F 10/005* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 8,816,735 B1* | 8/2014 | Chen | H03L 7/085 327/149 |
| 2013/0058437 A1* | 3/2013 | Oshima | H03M 1/0836 375/316 |
| 2014/0097875 A1* | 4/2014 | Tertinek | H03L 7/1976 327/105 |
| 2014/0266848 A1* | 9/2014 | Henzler | H03M 1/50 341/166 |
| 2015/0074156 A1* | 3/2015 | Degani | G06F 5/00 708/204 |
| 2015/0116018 A1* | 4/2015 | Chen | H03L 7/091 327/159 |
| 2015/0145566 A1* | 5/2015 | Perrott | H03L 7/0991 327/154 |
| 2015/0145569 A1* | 5/2015 | Perrott | H03L 7/093 327/157 |
| 2015/0241850 A1* | 8/2015 | Henzler | G04F 10/005 341/120 |

* cited by examiner

*Primary Examiner* — Adam Houston
(74) *Attorney, Agent, or Firm* — Eschweiler & Associates, LLC

(57) ABSTRACT

A digital phase locked loop operates with a time-to-digital converter and an a-priori-probability-phase-estimation component or estimator component that estimates the un-quantized phase associated with a quantization output of the time-to-digital converter. The time-to-digital converter generates a quantized value as the quantization output from a local oscillator signal of a local oscillator and a reference signal of a reference clock. The estimation component estimates a phase value from the quantized values as a function of a-priori data related to the time-to-digital converter and boundaries of the quantized value.

25 Claims, 8 Drawing Sheets

US 9,231,602 B1

A-PRIORI-PROBABILITY-PHASE-ESTIMATION FOR DIGITAL PHASE-LOCKED LOOPS

BACKGROUND

Digital phase-locked loops (DPLLs) are a viable alternative to traditional PLLs, in which a digital loop filter can be utilized to replace analog components. DPLLs can provide a low-power-space solution relative to old fashion analog phase-locked loops (PLLs). In DPLL architectures for oscillator generation, a phase offset between a local oscillator (LO) and a reference clock is measured using an analog to digital converter such as a time-to-digital converter (TDC). A measured phase is compared to a required phase and the result is used to correct the LO frequency. As a result of a conversion to the digital domain, the phase measurements can suffer from quantization errors, which then become inserted into a control loop of the DPLL and limit the DPLL Phase-Noise (PN) performances. Solutions to overcome or further reduce the quantization errors of DPLLs without increasing power consumption or further complicating circuit designs would increase the viability of DPLLs as desired operational components for oscillator generation.

DETAILED DESCRIPTION

Figure 1:
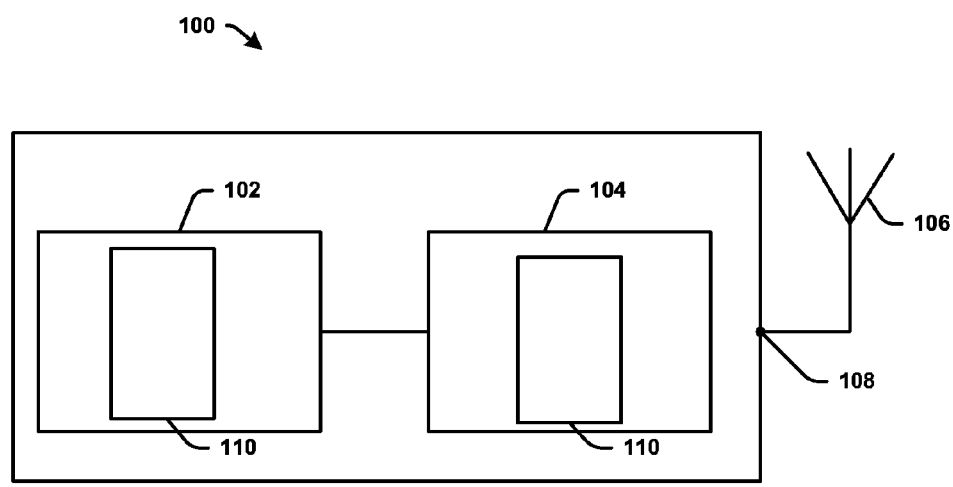
FIG. 1 illustrates an exemplary communication device comprising at least an exemplary DPLL in accordance with various aspects described.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor, a process running on a processor, a controller, an object, an executable, a program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies and continued objectives, various aspects for DPLLs are disclosed, in which low power solutions are provided for mitigating or reducing quantization error being injected into the feedback control loop of the DPLL. In particular, the solutions disclosed can be performed entirely in the digital domain without affecting the analog circuit design. For example, all-digital-phase-locked-loops (ADPLLs) can be readily adapted to these techniques.

A DPLL can comprise an a-priori probability phase estimation (APPPE) component or an estimation component that operates to mitigate the quantization error being introduced into the control loop by utilizing a-priori knowledge about the TDC, such as a number of quantization levels of the TDC and input parameters to the TDC. The quantization levels of the TDC and a distribution of the input, for example, are utilized to determine a more precise quantification of the phase and thereby improve the phase estimation after receiving the TDC output and the DPLL operation locked.

For example, the TDC is configured to generate an expected quantization of a phase (quantized phase). A phase offset is measured between a local oscillator signal of a local oscillator and a reference signal of a reference clock, in which a measured phase is compared to a required phase to generate a quantized output. An estimator component receives the quantized output phase as an output from the TDC and generates an estimation of the phase or of a phase offset as a function of a statistical distribution of an actual phase, the quantization levels of the TDC, or other a priori knowledge as well as a set (one or more) of observed boundaries of an output of the TDC. The estimation component utilizes various techniques to perform phase estimation and reduces the quantization phase error associated with the quantized phase that is output from the TDC or provided to the control loop with a lowest or minimal power option. Additional aspects and details of the disclosure are further described below with reference to figures.

Referring to FIG. 1, illustrated is an exemplary communication device 100 comprising a DPLL in accordance with various aspects being described. The communication device 100 can comprise a mobile or wireless device, for example, and further includes a digital baseband processor 102, an RF frontend 104 and an antenna port 108 for connecting to an antenna 106. The device 100 can comprise an exemplary DPLL 110 as part of the digital baseband processor 102 or the RF frontend 104. The digital baseband processor 102 or the RF frontend 104 can comprises such a DPLL 110 or even comprises more than one of such DPLL 110. The RF frontend 104 is coupled to the digital baseband processor 102 and the antenna port 108.

In one aspect, the DPLL 110 can operate as an ADPLL, in which each component within the DPLL is entirely a digital component, or as a different type of DPLL. The DPLL 110 can comprise a TDC and an estimator component, for example, that can operate together with a reduced delay mismatch between two single ended chains, which can be formed by delay elements of a differential delay line of a TDC, for example. The delay mismatch can be reduced or eliminated, for example, by utilizing a-priori probability-phase estimation processes at the estimator component. The advantages lead to a better phase noise performance, a symmetrical clock generation and a reduction in quantization noise after the DPLL becomes locked for operation. The quantization noise can be reduced when the DPLL 110 is used with an estimation of the un-quantized phase output by the TDC as a function of a priori knowledge of the TDC and of input values to the TDC, which facilitates a reduction of noise based on a statistical distribution of a phase error.

Further, the DPLL 110 achieves a resolution enhancement, for example, when the DPLL 110 is operated with one or more estimator components in a closed loop (feedback control loop) in response to or after the DPLL is locked. Hence, the DPLL 110 enables or facilitates a more precise generation of clock signals in the communication device 100 and a more precise measuring of time differences (such as in a DPLL) by reducing the quantization errors being injected into the control loop. The improved generation of a quantized phase and measuring of time differences enables a reduction of a noise floor in the mobile communication device 100 and thus improves the overall performance of the communication device 100.

Figure 2:
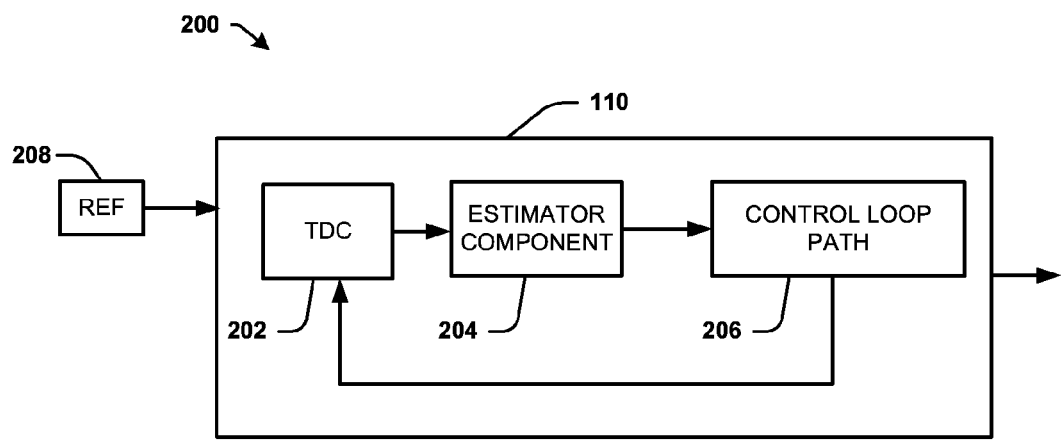
FIG. 2 illustrates an exemplary DPLL in accordance with various aspects described.

Referring now to FIG. 2, illustrated is an exemplary implementation of a DPLL 200 in accordance with various aspects described. The DPLL 110 comprises a TDC 202 coupled to an estimator component 204 that operates to reduce or eliminate a quantization error present in an output of the TDC and that is injected into a control loop path 206.

The TDC 202 operates to achieve digital encoding of a phase error, a phase delay, or a phase offset as a quantized value or a quantization output that is from a measured phase and a comparison between a reference clock signal and an oscillator signal (e.g., a local oscillator, a digitally-controlled oscillator or the like) to allow interfacing with components in a control loop path 206, such as a digital loop filter or the like. In one aspect, the TDC 202 operates to determine the quantized (phase) value as a function of a ratio between a first frequency of the local oscillator and a second frequency of a reference clock 208. An actual phase is measured and compared to an expected phase to match a required frequency. The TDC 202 then operates to generate a quantized phase value that corrects for the phase offset in the digital phase locked loop and enables the phase locked loop to settle into as close to the required phase as possible in a locked mode of operation.

The output of the TDC 202 is a quantized value that is provided to the estimator component 204. The estimator component 204 is configured to process APPPE processes with the output from the TDC 202. The APPPE operations comprises determining and retrieving a-priori data that is related to the TDC 202 to further refine the quantization output of the TDC 202, such as by modifying the output of the TDC 202 or reducing the quantization error being injected into the control path 206 from the TDC 202 to the control loop path. The result of the APPPE processes can further be implemented as a pre-TDC component rather than a post-TDC component as illustrated, or both depending upon system architectures, such that a modification of the quantized error is provided to the input or an output of the TDC 202 depending upon one or more architectures employing the DPLL 200.

The estimation component 204 operates to estimate a phase value of an un-quantized phase by obtaining a-priori knowledge related to the TDC 202, which can include the required phase value being utilized by the TDC 202 for quantitating time intervals, a number of quantizing levels of the TDC 202, the position of the quantizing levels for each sample, and a set of data pertaining to the input of the TDC 202. For example, the input can include a reference signal from the reference clock 208, a local oscillator signal from a local oscillator (not shown) of the control loop path 206, a required or expected phase value provided either in a feedback path or other path, as well as errors associated with any number of components, specifically the local oscillator (not shown) and the reference clock 208. Additional data provided to the TDC 202 can also be utilized and retrieved as a-priori data that is either about the TDC 202 parameters and calibration settings or inputs being received and processed by the TDC before or concurrent to actually being processed by the TDC 202.

In one aspect, the estimator (APPPE) component 204 further analyzes data being outputted by the TDC 202 to ascertain further information or data about the TDC 202 and generates an analysis of the data being received with the a-priori data to further refine estimation of a phase value and mitigate quantization error. The data received by the estimation component 204 can be analyzed by identifying a set (one or more) of boundaries within quantization values that correspond to each sample in generation of the TDC 202 output. The boundaries, for example, can be observed by the estimator component 204 as part of interfacing output data from the TDC 202 to components of the control loop path 206 for digital encoding phase values. The boundaries can be a ceiling level and a floor level that respectively comprise high or maximum levels and low or minimum levels of a phase error, a quantization error inherent in the quantization value provided by the TDC 202, or as un-quantized phase depending upon a center of gravity or a minimum error power with respect to the estimated phase value along a statistical distribution.

The estimator component 204 is further configured to evaluate the input data of the TDC 202 and generate a statistical distribution about a center of an expected noise. The statistical distribution, for example, can comprise a random statistical distribution of a phase error component about an expected phase for a required frequency of operation. The random statistical distribution can be a distribution of the error and represented, for example, as a Gaussian distribution such as an additive white Gaussian noise distribution or other statistical distribution along a centroid, for example. The estimator component 204 thus operates to utilize the a-priori data related to the TDC 202 and boundaries extrapolated from the output to estimate a further input to the TDC 202 and reduce quantization error in the TDC output before being injected into the control loop 206. The estimator component 204 further operates to modify the quantization value by further quantizing a phase value at a more refined resolution. The estimator component 204 and associated processes can be fully performed in the digital domain and after the DPLL is locked for phase-frequency synchronization.

The process employed by the estimator component 204 comprise phase estimation processes with a minimal or lowest error power, and thus operate to insert the minimal amount of quantization noise into the control loop as part of the estimation within the boundaries. The resulting operations of the estimator component 204 facilitate a lower phase-noise in the output of the DPLL 200. In general, DPLLs are limited by the quantization noise, which is primarily determined by the TDC circuit 202, for example. As such to enable design flexibility, the estimator component 204 of the DPLL provides an advantage of an all-digital solution for improving this quantization noise without altering any analog circuits of a system. Low power DPLLs further often utilize TDCs with few quantization levels (i.e., provide higher quantization noise). For these cases in particular, a noise reduction advantage is increased and, as with all cases, the performance to power ratio is further improved.

Figure 3:
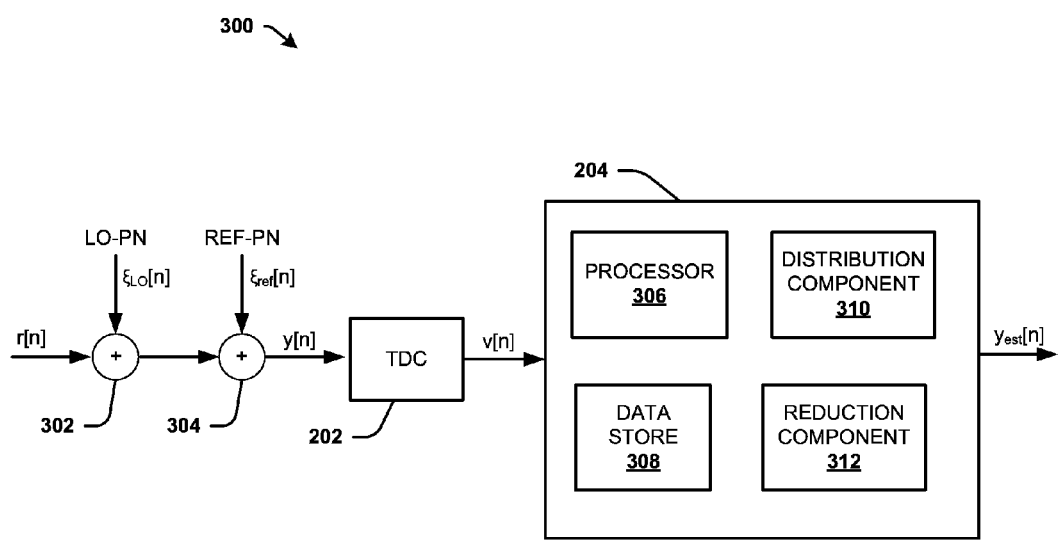
FIG. 3 illustrates another DPLL in accordance with various aspects described.

Referring to FIG. 3, illustrated is an example of a phase locked loop (PLL) system 300 that operates to synchronize or generate a synchronous frequency with a reduced quantization error in a locked mode of operation in accordance with various aspects. The system 300 comprises similar components as discussed above, and additionally includes summing nodes 302 and 304, as well as further components such as one or more processing devices 306 and a data store 308, for example, integrated in the system 300. These components operate in the system 300 to reduce or mitigate quantization error or further quantize un-quantized phase components of a phase resulting from an output v[n] of the TDC 202 in response to or concurrent to the DPLL operating in a locked mode of operation.

For example, the estimator component 204 can operate to generate a reduction in the quantization error of the output v[n], or otherwise provides a phase estimation of a phase with a minimal error. As discussed above, the estimator component 204 generates an estimation by utilizing data (e.g., observed boundaries) related to the output v[n] received from the TDC 202 and also a-priori data related to TDC 202. The a-priori data can include data about the input y[n] received by the TDC 202, a number of quantization levels of the TDC 202 for processing the input y[n], or a position of the quantization levels. The estimator component 204 is configured to estimate the input y[n] that is being received by the TDC 202 and reduce the quantization error or further quantize un-quantized phase with the output v[n] of the TDC 202 as a function of the estimation of the input y[n].

An objective of the PLL system 300, or a DPLL system, for example, is to synchronize or lock in a locked frequency/phase mode a local oscillator (LO) frequency in order to match a required frequency. In a noiseless PLL, for example each sampling of the LO would be received with a specific phase (an expected phase r[n]). In an actual PLL, the LO phase follows the expected phase with a small error around it (as an actual phase), in which the error is considered the phase noise (PN). The estimator component 204 comprises a distribution component 310 that analyzes the error received by the TDC 202 within the input and generates a statistical distribution of the error about the phase as an actual phase of the LO and of the reference clock or a reference crystal (denoted as the combined error components $\epsilon_{LO}[n]$ and $\epsilon_{ref}[n]$), for example. The expected phase is combined with these error components and received as an input to the TDC 202, which then produces a quantized value v[n] as a function of the input y[n].

The distribution component 310 of the estimator component 204 is configured to generate a statistical distribution of the a-priori data by analyzing the expected phase or phase ramp based on the required frequency and the errors surrounding it. For example, a random variable can be distributed around the expected phase as the actual phase based on the error components of the input. The phase error $\epsilon_{LO}[n]$ and $\epsilon_{ref}[n]$ can be treated as an additive white Gaussian noise, for example. The estimator component 204 can then further operate a distribution analysis, such as a minimum-mean-square-error (MMSE) estimation, for example, to further determine a minimum error power or a lowest error power for providing a reduction in a quantization noise in an entire digital solution. The estimator component 204 then outputs an estimation of the input y[n] as $y_{est}[n]$ and provides a reduction in quantization error into the feedback control loop.

For example, the estimator component 204 further determines observed boundaries for each sample receive by the TDC 202 by analyzing ceiling or high level boundaries and floor or low level boundaries of the TDC output v[n]. The boundary determination can be determined to be parameters of the distribution being analyzed. The focus of a region along the distribution provides a mapping of where the input to the TDC 202 is provided as the actual phase being processed rather than the expected phase. From this process, the estimator component 204 can utilize the determined boundaries and a statistical distribution of the actual phase about an expected phase to estimate the phase, a phase value or a phase differential that corrects the quantized output phase to account for previously un-quantized phase or reduce phase error that is injected into the control loop. The estimator component 204 operates to improving a performance-to-power ratio of the digital phase locked loop as a function of the correction via the estimation with a minimum error power.

By way of further example, the reduction component 312 is configured to reduce a quantization error of the quantized value that is inserted into a feedback loop or control loop path coupled to the TDC 202 and the estimator component 204. The reduction is a result of the estimation of the phase error and an estimation of an actual phase to accommodate for the interval differential in the control loop path. The estimation can be a function of the a-priori data that includes an expected phase, the actual phase comprising a statistical distribution of the phase error about the expected phase and a position of a set of quantization levels of the time-to-digital converter associated with the quantized value, as well as a profile of boundaries ascertained from the TDC output.

A definition of the estimation generated by the estimator component can be mathematically illustrated as follows:

$$\hat{y}[n]=\mathrm{argmin}_y \hat{E}\{(\hat{y}[n]-y[n])^2|y[n]\epsilon(v_{k-1},v_k)\}, \qquad \text{(Eqn. 1)}$$

wherein $\hat{y}[n]$ is the estimation of the input to the TDC 202 y[n] and for each sample quantized $v_k[n]$, and the boundaries are represented as $y[n]\epsilon(v_{k-1},v_k)$. The optimal estimator is the estimation operator with a minimum error-power or that provides the lowest error power, and thus enables a maximum increase in the advantage of an all-digital estimation just after the TDC 202 output and after/during the DPLL being locked for operation, which improves the performance to power ratio of the DPLL. In particular, the quantization levels of the TDC 202 can be non-uniform or uniform, but are ascertained and known by the estimator component for estimation of a phase value (post-calibration of the TDC, for example). The LO phase is assumed to follow the expected phase ramp, but the estimation processes are not limited as such. The LO PN is a residual PN (as an error of the expected phase, after locking mode (which is a different noise from a 1/f PN in an open loop design)). The combination of both PN (of LO and REF clock) is assumed to be Gaussian and white as an approximation once the PLL is locked; however, other statistical distributions could also be envisioned.

Figure 4:
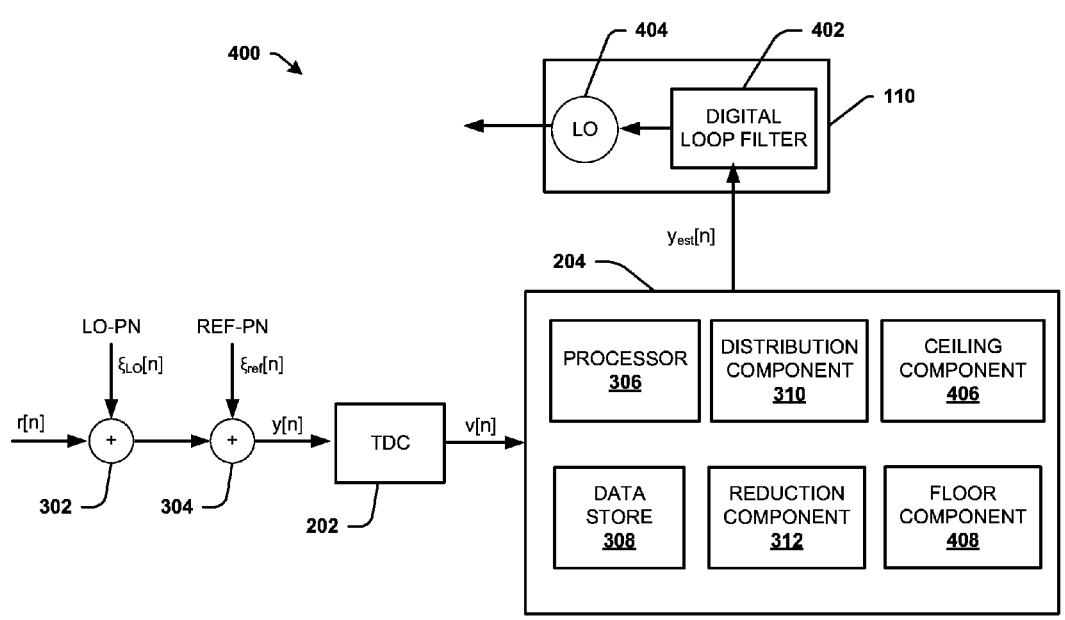
FIG. 4 illustrates another DPLL in accordance with various aspects described.

Referring to FIG. 4, illustrated is another example of a DPLL system 400. The system 400 includes the TDC 202 coupled to the estimator (APPPE) component 204 and the feedback control loop 110. The feedback control loop 110 can comprise a digital loop filter 402 and a local oscillator 404 (e.g., a digitally control oscillator or the like). The digital loop filter 402 is coupled to the estimator component 204, receives the estimated quantized value $y_{est}[n]$, and acts to filter out a high frequency noise produced by the TDC 202.

In addition, the estimator component 204 includes similar components as discussed above and further comprises a ceiling component 406 and a floor component 408 for extracting a posteriori data related to the output v[n] of the TDC and combining the data with the a priori data related to the input y[n] in a TDC profile for each sample. The TDC profile can be stored in the data store 308 and provided as input to the distribution component 310 for further statistical analysis on a statistical distribution of the profile. For example, the ceiling component 406 is configured to determine a ceiling level of the quantized value as an approximate high output level observed from the TDC 202 for a current phase sample. The floor component 408 configured to determine a floor level of the quantized value as an approximate low output level observed from the time-to-digital converter for the current phase sample.

Figure 5:
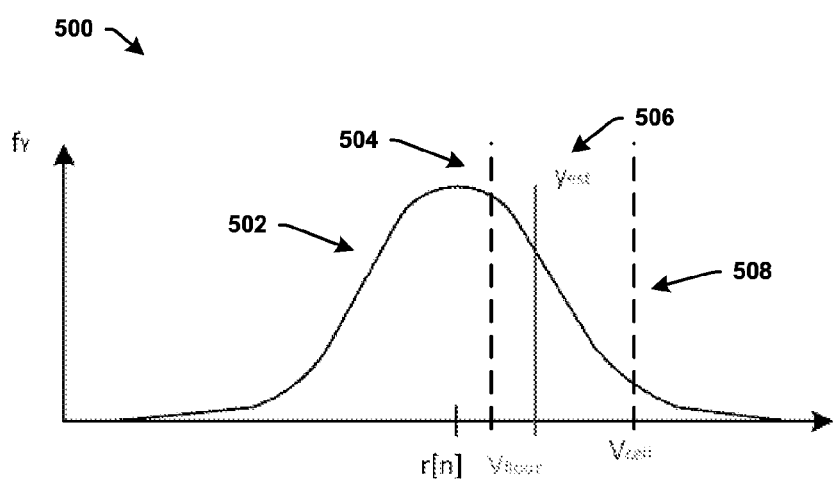
FIG. 5 illustrates an example graph of a profile of data related to a TDC of a DPLL for estimation processes in accordance with various aspects described.

Referring to FIG. 5, illustrated is a graph 500 of a data profile related to a TDC in accordance with various aspects described. The estimator component 204 of the DPLL discussed above can operate to generate a profile of data related to the TDC and estimate a phase value based on the profile data. For example, at each sample an expected phase r[n] and a phase error comprising the LO phase noise and the reference clock phase noise can be identified and formulated into a statistical distribution about the expected phase required for frequency matching in a locked mode of operation.

The estimator component 204 estimates the input y[n] of the TDC 202 and generates an estimation of an estimated value of a phase $y_{est}[n]$ to be injected into a control loop to the TDC 202 to reduce an error or an un-quantized portion of the phase provided in the quantized phase of the TDC output. The output of the TDC 202 is observed by the ceiling component 406 and floor component 408, for example, and extracted as boundaries 504, 506 of a distribution 502 of the TDC input. The x-axis of the graph 500 can represent characteristic phase values and the y-axis represents a probability distribution function (PDF) of the phase values. In this particular example, the estimated value is determined to be at a level closer to the floor value $v_{floor}$ of the output v[n] as compared to the ceiling $v_{ceil}$, however, this can vary depending upon the boundaries extracted from the output or the a posteriori data received. The boundaries are superimposed onto the statistical distribution of the input, a priori data to the TDC and based on the position of the centroid or expected phase a statistical estimation is generated to reduce phase error from the output being received and to the input of the control loop, such as a digital loop filter, for example.

The quantization levels can be non-uniform and known by the estimator component 204 for generating the estimations. The phase of the LO can be considered to follow the expected phase ramp r[n] and the LO PN can be a residual PN or error from the expected phase after a locking mode is set. The combination of both PN in the LO and reference clock signal from a reference clock can be Gaussian and white. The estimator component 204 can then operate a statistical distribution analysis on the data, such as a minimum-mean-square-error (MMSE) estimation to determine an output $y_{est}[n]$ to the digital loop filter or control loop.

Figure 6:
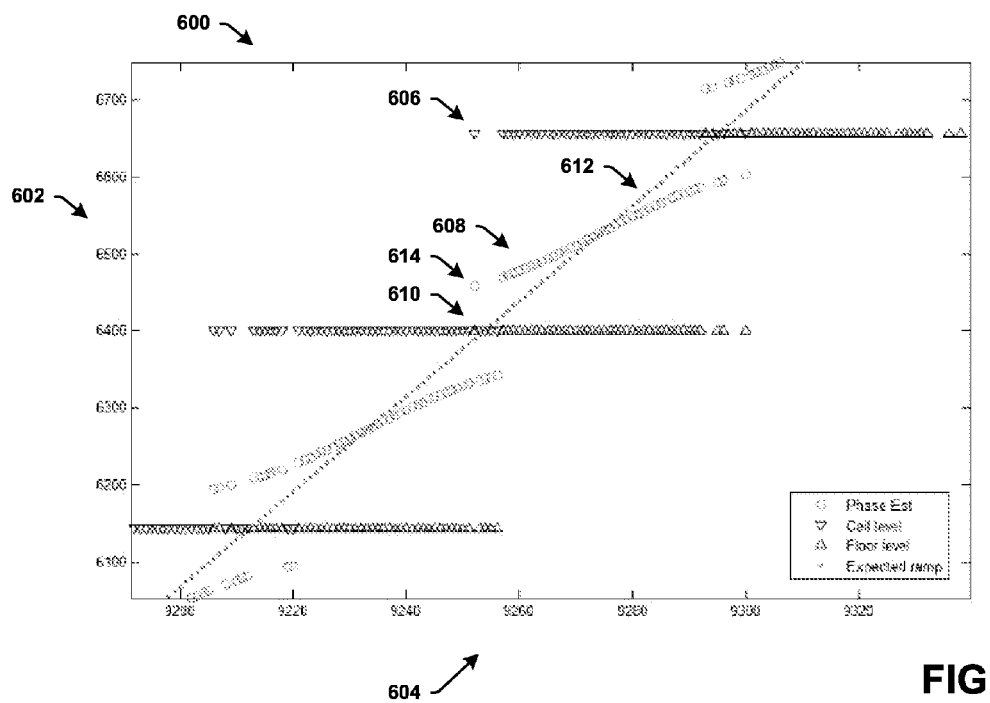
FIG. 6 illustrates an example simulation graph of a DPLL in accordance with various aspects described.

Referring to FIG. 6, illustrated is another graph 600 that demonstrates simulation aspects of the DPLL systems discussed. The vertical axis represents phase values and the horizontal axis represents time values. Quantization levels 606 and 610 are known as a part of the a-priori data ascertained by the estimator component 204. The number of quantization levels and position values for each sample can be utilized to impose an expected phase ramp 612. The actual phase as an input to the quantizer is not shown, but would be demonstrated by a curve about the expected phase r[n] 612 with a variance. An estimation of a phase 608 is provided at each sample. The boundaries of each output provide a ceiling or floor level with an indication as such given according to the portion of the timed sample being processed. In one example estimation value 614, the estimated value is predicted as above the quantized level 610, below the quantized level 606 that is expected based on a-priori knowledge and estimated to be located on along a curve according to a statistical distribution estimation process (e.g., MMSE) with a minimal error power set for the outcome.

The estimation generated by the estimator component can be further illustrated as follows:

$$\hat{y}[n]=\mathrm{argmin}_{\hat{y}} E\{(\hat{y}[n]-y[n])^2 | y[n]\epsilon(v_{k-1},v_k)\} = \mathrm{argmin}_{\hat{y}} \int_{v_{k-1}}^{v_k}(\hat{y}[n]-y[n])^2 f_y(Y)dy, \quad \text{(Eqn. 2)}$$

wherein $\hat{y}[n]$ is the estimation of the input to the TDC 202 y[n] and for each sample quantized $v_k[n]$, and the boundaries are represented as $y[n]\epsilon(v_{k-1},v_k)$ Eqn. 2 follows as $$\Rightarrow \frac{\delta}{\delta \hat{y} v_{k-1}} \mathrm{argmin}_{\hat{y}} \int_{v_{k-1}}^{v_k} (\hat{y}[n]-y[n])^2 f_y(y) dy = 0,$$

which follows as $$\hat{y}=\int_{-\infty}^{\infty} y \cdot f_{y|y[n]\epsilon(v_{k-1},v_k)}(y)dy = E\{y|y[n]\epsilon(v_{k-1},v_k)\} \quad \text{(Eqn. 3).}$$

The error that results in the minimum error power is selected as the expectation of the desired range values given the observations of the boundaries. For each sample quantized $v_k[n]$ the boundaries are observed $y[n]\epsilon(v_{k-1},v_k)$. The estimation objective is to estimate y[n] with a distribution as approximately $y[n] \sim N(r[n],\sigma_\epsilon^2)$. The solution of the expectation of the estimation between the integral of the boundaries is demonstrated as follows:

$$y[n] = r[n] + \frac{f_y(v_{k-1}) - f_y(v_k)}{F_y(v_k) - F_y(v_{k-1})} \cdot \sigma^2, \quad \text{(Eqn. 4)}$$

wherein $f_y$ and $F_y$ are the probability distribution function (PDF) and the cumulative distribution function (CDF) of y, respectively. The graph 600 illustrates further that the expected phase is a function of a combination between the expected phase ramp and the input quantized level as a priori knowledge. Simulations further demonstrate an improvement of at least about 2.1 dB or greater in phase noise reduction.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 7:
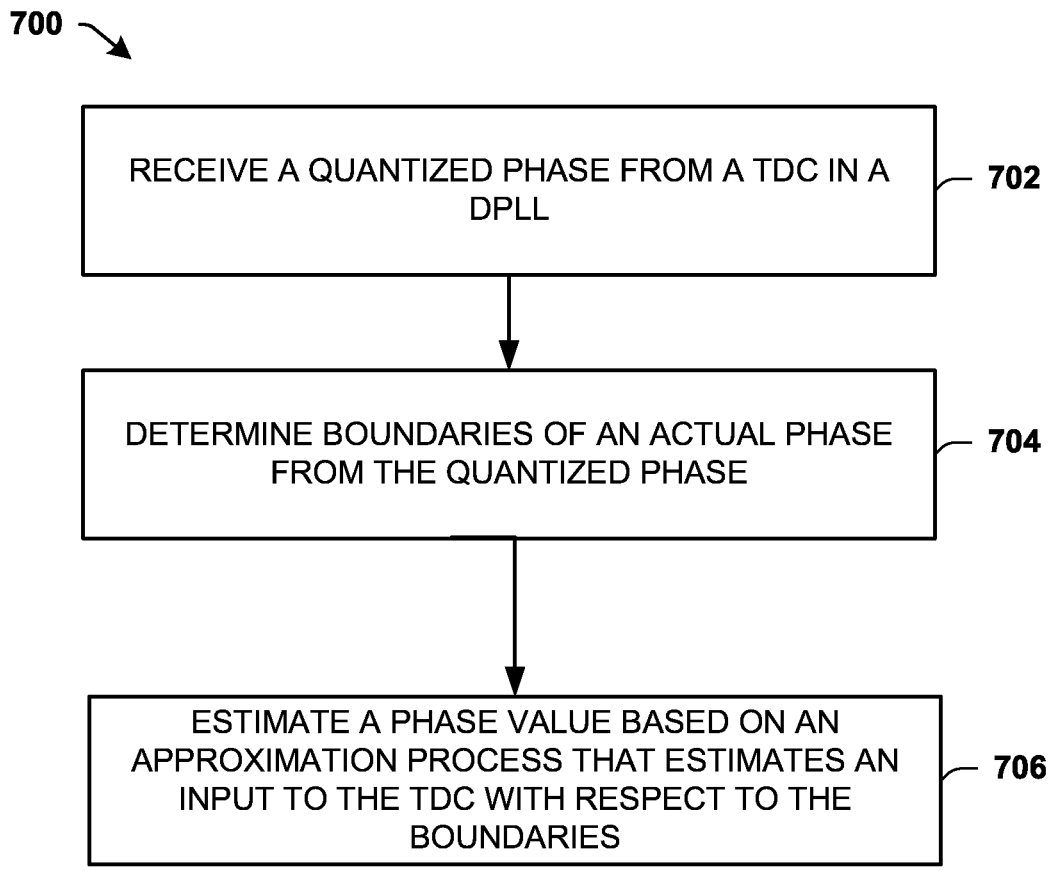
FIG. 7 illustrates a flow diagram of an exemplary method in accordance with various aspects described.

Referring to FIG. 7, illustrated is an example method for utilizing a DPLL for phase estimation based on an output from a TDC and a priori data related to the TDC. The method 700 can be implemented as an entire digital process to reduce quantization error in the output of the TDC. The method 700 initiates at 702 with receiving a quantized phase from a TDC (e.g., TDC 202) in a DPLL.

At 704, boundaries of an actual phase from the quantized phase are determined. Determining the boundaries can include determining a time-to-digital quantization level from among a number of a plurality of quantization levels of the time-to-digital converter as well as a ceiling level and a floor level of the actual phase, for example.

At 706, an estimation is generated of a phase value base on an approximation process, such as a statistical distribution of the input to the TDC, for example, which can be performed with respect to the boundaries of the actual phase. For example, the statistical distribution can comprise performing a minimum-mean-square-error estimation of the random variable distribution about the expected phase with the boundaries to estimate the phase value or a phase offset from the expected phase with an error or statistical variance (e.g., σ) about it for a number of quantization levels (N).

The method can further comprise generating a correction to the quantized phase as a function of the estimation generated by the approximation process by inserting the correction or estimated input phase value into a control loop path of the digital phase locked loop. A performance to power ratio of the digital phase locked loop can be improved as a function of the correction by the estimation with a minimum error power.

Figure 8:
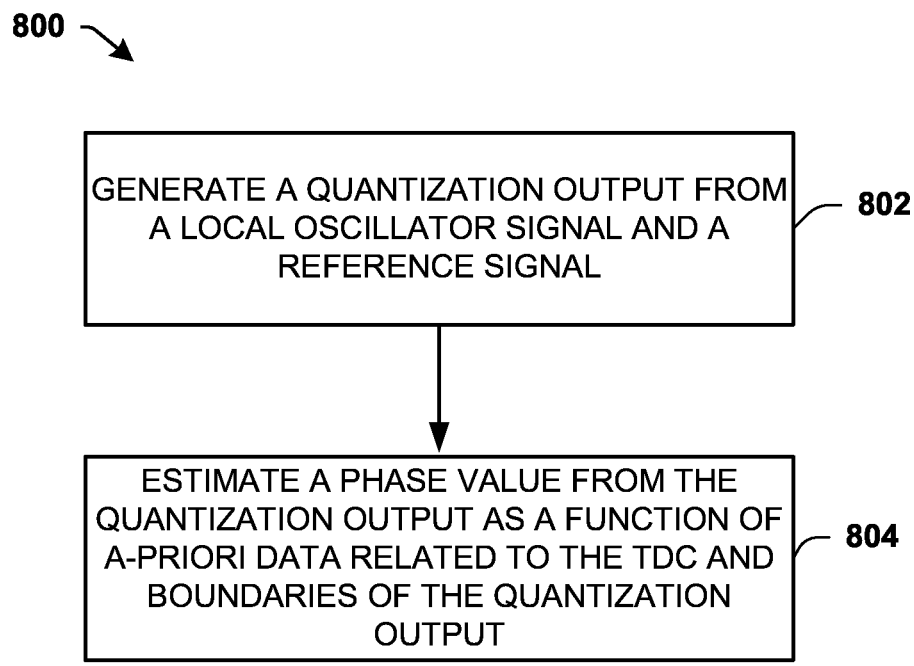
FIG. 8 illustrates a flow diagram of another exemplary method in accordance with various aspects described.

Referring to FIG. 8, illustrated is another method 800 in accordance with various aspects. The method 800 initiates at 802 with generating a quantization output from a local oscillator signal and a reference signal, such as via a TDC of a DPLL. At 804, a phase value is estimated from the quantization output as a function of a-priori data related to, directly affecting (e.g., inputs), or calibrated into the TDC (e.g., a number of quantization levels, such as quantization values, delays, factorizations, circulations or the like digital abstractions designed for the TDC). The estimation of the phase values is further a function of the boundaries extracted from the quantization output. The quantization output is then modified or corrected by the estimation determined so that an improved tuning of either less error or pervious unaccounted for quantized phase is quantized. The estimation can select the lowest estimation to introduce error from the location of the expected phase based on the centroid position with respect to the boundaries, the boundaries and the statistical distribution of the actual phase for facilitating reduced phase error into the control loop once the DPLL is already locked.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a digital phase locked loop that comprises a time-to-digital converter configured to generate a quantized value between a local oscillator signal of a local oscillator and a reference signal of a reference clock. An estimator component is configured to receive the quantized value and generate an estimation of a phase value from the quantized value as a function of a set of a-priori data related to the time-to-digital converter and boundaries of the quantized value.

Example 2 includes the subject matter of Example 1 and a distribution component configured to determine the set of a priori data comprising a statistical distribution of input to the time-to-digital converter comprising an expected phase with a phase error and facilitate a reduction of a quantization error associated with the quantized value that is provided into a feedback loop based on the estimation.

Example 3 includes the subject matter of any of Examples 1 and 2 including or omitting optional elements, wherein the estimator component is further configured to generate the estimation of the phase value from the quantized value as a function of the set of a priori data that comprise a required phase value and a set of boundaries derived from quantization levels of the time-to-digital converter.

Example 4 includes the subject matter of any of Examples 1-3, including or omitting optional elements, wherein the estimator component is further configured to generate the estimation of the phase value as a minimum-mean-square-error estimation of an un-quantized phase amount to the quantized value.

Example 5 includes the subject matter of any of Examples 1-4, including or omitting optional elements, wherein a reduction component is configured to reduce a quantization error of the quantized value that is inserted into a feedback loop coupled to the time-to-digital converter and the estimator component.

Example 6 includes the subject matter of any of Examples 1-5, including or omitting optional elements, wherein the reduction component is further configured to reduce the quantization error as a function of a floor boundary and a ceiling boundary of an observed time-to-digital level from the quantized value as an output of the time-to-digital converter and an expected phase.

Example 7 includes the subject matter of any of Examples 1-6, including or omitting optional elements, wherein a ceiling component is configured to determine a ceiling level of the boundaries as an approximate high output level observed from the time-to-digital converter for a current phase sample, and a floor component is configured to determine a floor level of the boundaries as an approximate low output level observed from the time-to-digital converter for the current phase sample.

Example 8 includes the subject matter of any of Examples 1-7, including or omitting optional elements, wherein the estimator component is further configured to generate the phase value based on an estimation of an estimator component, boundaries of an actual phase having a phase error as a statistical distribution about an expected phase, wherein the estimation of the phase value is further a function of the boundaries that are derived from quantization levels of the time-to-digital converter associated with the quantized value that comprise a ceiling level and a floor level along a center of gravity of the statistical distribution as a minimum error-power.

Example 9 includes the subject matter of any of Examples 1-8, including or omitting optional elements, wherein a reduction component is configured to reduce a quantization error of the quantized value as a function of the estimation, wherein the estimation is a function of a set of a priori data comprising an expected phase, the actual phase comprising a statistical distribution of the expected phase with a phase error component and a position of a set of quantization levels of the time-to-digital converter associated with the quantized value.

Example 10 includes the subject matter of any of Examples 1-9, including or omitting optional elements, wherein the estimator component is further configured to estimate an input of the time-to-digital converter that is a function of an expected phase and a phase noise of the local oscillator signal and the reference signal.

Example 11 is a method that comprises receiving, via an estimator component, a quantized phase from a time-to-digital converter in a digital phase locked loop. The method further comprises determining, via the estimator component, boundaries of an actual phase from the quantized phase, and estimating a phase value based on an approximation process that estimates an input to the time-to-digital converter with respect to the boundaries of the actual phase.

Example 12 includes the subject matter of Example 13, including or omitting optional elements, wherein the determining of the boundaries comprises determining a time-to-digital quantization level from among a number of a plurality of quantization levels of the time-to-digital converter and a ceiling level and a floor level of the actual phase.

Example 13 includes the subject matter of Examples 11 and 12, including or omitting optional elements, wherein the method further comprises determining the actual phase as a random variable distribution about an expected phase of the digital phase locked loop, and outputting the phase value to a digital loop filter of a control loop path.

Example 14 includes the subject matter of Examples 11-13, including or omitting optional elements, wherein the estimating of the phase value from the quantized phase is further based on the random variable distribution about the expected phase.

Example 15 includes the subject matter of Examples 11-14, including or omitting optional elements, wherein the method further comprises generating a minimum-mean-square-error estimation of the random variable distribution about the expected phase with the boundaries to estimate the phase value or a phase offset from the expected phase.

Example 16 includes the subject matter of Examples 11-15, including or omitting optional elements, wherein the estimating the phase value comprises determining a statistical distribution of a-priori information related to the time-to-digital converter as a part of the approximation process with respect to the boundaries of the actual phase.

Example 17 includes the subject matter of Examples 11-16, including or omitting optional elements, wherein the method further comprises generating a correction to the quantized phase as a function of an estimation generated by the approximation process and inserting the correction into a control loop path of the digital phase locked loop.

Example 18 includes the subject matter of Examples 11-17, including or omitting optional elements, wherein the method further comprises improving a performance to power ratio of the digital phase locked loop as a function of the correction by the estimation with a minimum error power.

Example 19 includes the subject matter of Examples 11-18, including or omitting optional elements, wherein the quantized phase is based on a number of quantization levels of the time-to-digital converter.

Example 20 includes the subject matter of Examples 11-19, including or omitting optional elements, wherein the method further comprises determining a random variable distribution about an expected phase comprising a phase error as the input to the time-to-digital converter, and performing a minimum-mean-square-error estimation on the random variable distribution for estimating the phase value.

Example 21 is a mobile device or apparatus comprising a digital phase locked loop circuit comprising a time-to-digital converter configured to generate a quantization output from a local oscillator signal of a local oscillator and a reference signal of a reference clock, and an estimator component configured to generate an estimation of a phase value from the quantization output as a function of a set of a-priori data related to the time-to-digital converter and boundaries of the quantization output.

Example 22 includes the subject matter of Example 21, wherein the estimator component is further configured to generate the estimation as a function of the set of a-priori data that is related to quantization levels of the time-to-digital converter and a statistical distribution of an input to the time-to-digital converter.

Example 23 includes the subject matter of any of Examples 21-22, including or omitting optional elements, wherein the estimator component generates a minimum-mean-square error estimation on a statistical distribution of a phase error inputted to the time-to-digital converter with the boundaries defined by the quantization output and a position of a plurality of quantization levels of the time-to-digital converter associated with the quantization output.

Example 24 includes the subject matter of any of Examples 21-23, including or omitting optional elements, wherein a reduction component is configured to reduce a quantization error of the quantization output that is inserted into a closed loop as a function of a floor boundary and a ceiling boundary of an observed time-to-digital level from the quantization output from the time-to-digital converter and an expected phase value.

Example 25 includes the subject matter of any of Examples 21-24, including or omitting optional elements, the estimator component is further configured to generate the estimation of the phase value after the digital phase locked loop circuit becomes locked for generation of digital timing signals.

Applications (e.g., program modules) can include routines, programs, components, data structures, etc., that perform particular tasks or implement particular abstract data types. Moreover, those skilled in the art will appreciate that the operations disclosed can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated mobile or personal computing devices.

A computing device can typically include a variety of computer-readable media. Computer readable media can be any available media that can be accessed by the computer and includes both volatile and non-volatile media, removable and non-removable media. By way of example and not limitation, computer-readable media can comprise computer storage media and communication media. Computer storage media includes both volatile and non-volatile, removable and non-removable media implemented in any method or technology for storage of information such as computer-readable instructions, data structures, program modules or other data. Computer storage media (e.g., one or more data stores) can include, but is not limited to, RAM, ROM, EEPROM, flash memory or other memory technology, CD ROM, digital versatile disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

It is to be understood that aspects described herein may be implemented by hardware, software, firmware, or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may comprise one or more modules operable to perform one or more of the acts and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), CDMA2000, etc. UTRA includes Wideband-CDMA (W-CDMA) and other variants of CDMA. Further, CDMA2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA2000 and UMB are described in documents from an organization named "3rd Generation Partnership Project 2" (3GPP2). Further, such wireless communication systems may additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical discs (e.g., compact disc (CD), digital versatile disc (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product may include a computer readable medium having one or more instructions or codes operable to cause a computer to perform functions described herein.

Further, the acts and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the acts and/or actions of a method or algorithm may reside as one or any combination or set of codes and/or instructions on a machine-readable medium and/or computer readable medium, which may be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature may have been disclosed with respect to only one of several implementations, such feature may be combined with one or more other features of the other implementations as may be desired and advantageous for any given or particular application.

What is claimed is:

1. A digital phase locked loop comprising:
   a time-to-digital converter configured to generate a quantized value based on a local oscillator signal of a local oscillator and a reference signal of a reference clock; and
   an estimator component configured to receive the quantized value and generate an estimation of a phase value from the quantized value as a function of a set of a-priori data related to the time-to-digital converter and boundaries of the quantized value.

2. The digital phase locked loop of claim 1, further comprising:
   a distribution component configured to determine the set of a priori data comprising a statistical distribution of input data to the time-to-digital converter that includes an expected phase with a phase error, and facilitate a reduction of a quantization error associated with the quantized value that is provided into a feedback loop based on the estimation.

3. The digital phase locked loop of claim 1, wherein the estimator component is further configured to generate the estimation of the phase value from the quantized value as a function of the set of a priori data that comprise a required phase value and the boundaries derived from quantization levels of the time-to-digital converter.

4. The digital phase locked loop of claim 1, wherein the estimator component is further configured to generate the estimation of the phase value as a minimum-mean-square-error estimation of an un-quantized phase amount to the quantized value.

5. The digital phase locked loop of claim 1, further comprising:
   a reduction component configured to reduce a quantization error of the quantized value that is inserted into a feedback loop coupled to the time-to-digital converter and the estimator component.

6. The digital phase locked loop of claim 5, wherein the reduction component is further configured to reduce the quantization error as a function of a floor boundary and a ceiling boundary of an observed time-to-digital level from the quantized value as an output of the time-to-digital converter and an expected phase.

7. The digital phase locked loop of claim 1, further comprising:
   a ceiling component configured to determine a ceiling level of the boundaries as an approximate high output level that is observed from the time-to-digital converter for a current phase sample; and
   a floor component configured to determine a floor level of the boundaries as an approximate low output level that is observed from the time-to-digital converter for the current phase sample.

8. The digital phase locked loop of claim 1, wherein the estimator component is further configured to generate the phase value based on an estimation of an estimator component, and boundaries of an actual phase having a phase error as a statistical distribution about an expected phase, wherein the estimation of the phase value is further a function of the boundaries derived from quantization levels of the time-to-digital converter associated with the quantized value that comprise a ceiling level and a floor level along a center of gravity of the statistical distribution as a minimum error-power.

9. The digital phase locked loop of claim 1, further comprising:
   a reduction component configured to reduce a quantization error of the quantized value as a function of the estimation, wherein the estimation is a function of a set of a priori data comprising an expected phase, the actual phase comprising a statistical distribution of the expected phase with a phase error component and a position of a set of quantization levels of the time-to-digital converter associated with the quantized value.

10. The digital phase locked loop of claim 1, wherein the estimator component is further configured to estimate an input of the time-to-digital converter that is a function of an expected phase and a phase noise of the local oscillator signal and the reference signal.

11. A method comprising:
    receiving, via an estimator component, a quantized phase from a time-to-digital converter in a digital phase locked loop;
    determining, via the estimator component, boundaries of an actual phase from the quantized phase; and
    estimating a phase value based on an approximation process that estimates an input to the time-to-digital converter based on the boundaries of the actual phase and a set of a-priori data related to the time-to-digital converter.

12. The method of claim 11, wherein the determining of the boundaries comprises determining a time-to-digital quantization level from among a number of a plurality of quantization levels of the time-to-digital converter and a ceiling level and a floor level of the actual phase.

13. The method of claim 11, further comprising:
determining the actual phase as a random variable distribution about an expected phase of the digital phase locked loop; and
outputting the phase value to a digital loop filter of a control loop path.

14. The method of claim 13, wherein the estimating of the phase value from the quantized phase is further based on the random variable distribution about the expected phase.

15. The method of claim 13, further comprising:
generating a minimum-mean-square-error estimation of the random variable distribution about the expected phase with the boundaries to estimate the phase value or a phase offset from the expected phase.

16. The method of claim 11, wherein the estimating the phase value comprises determining a statistical distribution of the a-priori information related to the time-to-digital converter as a part of the approximation process with respect to the boundaries of the actual phase.

17. The method of claim 11, further comprising:
generating a correction to the quantized phase as a function of an estimation generated by the approximation process and inserting the correction into a control loop path of the digital phase locked loop.

18. The method of claim 17, further comprising:
improving a performance to power ratio of the digital phase locked loop as a function of the correction by the estimation with a minimum error power.

19. The method of claim 11, wherein the quantized phase is based on a number of quantization levels of the time-to-digital converter.

20. The method of claim 11, further comprising:
determining a random variable distribution about an expected phase comprising a phase error as the input to the time-to-digital converter; and
performing a minimum-mean-square-error estimation on the random variable distribution for estimating the phase value.

21. A mobile device comprising:
a digital phase locked loop circuit comprising:
a time-to-digital converter configured to generate a quantization output from a local oscillator signal of a local oscillator and a reference signal of a reference clock; and
an estimator component configured to generate an estimation of a phase value from the quantization output as a function of a set of a-priori data related to the time-to-digital converter and boundaries of the quantization output.

22. The mobile device of claim 21, wherein the estimator component is further configured to generate the estimation as a function of the set of a-priori data that is related to quantization levels of the time-to-digital converter and a statistical distribution of an input to the time-to-digital converter.

23. The mobile device of claim 21, wherein the estimator component generates a minimum-mean-square error estimation on a statistical distribution of a phase error inputted to the time-to-digital converter with the boundaries defined by the quantization output and a position of a plurality of quantization levels of the time-to-digital converter associated with the quantization output.

24. The mobile device of claim 21, further comprising:
a reduction component configured to reduce a quantization error of the quantization output that is inserted into a closed loop as a function of a floor boundary and a ceiling boundary of an observed time-to-digital level from the quantization output from the time-to-digital converter and an expected phase value.

25. The mobile device of claim 21, wherein the estimator component is further configured to generate the estimation of the phase value after the digital phase locked loop circuit becomes locked for generation of digital timing signals.

* * * * *